United States Patent [19]
White et al.

[11] Patent Number: 6,149,365
[45] Date of Patent: Nov. 21, 2000

[54] SUPPORT FRAME FOR SUBSTRATES

[75] Inventors: John M. White, Hayward; Larry Chang, Los Altos; Emanuel Beer, San Jose, all of Calif.

[73] Assignee: Applied Komatsu Technology, Inc., Tokyo, Japan

[21] Appl. No.: 09/399,900

[22] Filed: Sep. 21, 1999

[51] Int. Cl.[7] .................................................... F27D 5/00
[52] U.S. Cl. ........................... 414/217; 118/729; 432/121
[58] Field of Search ........................... 118/729; 414/217; 248/175; 432/121

[56] References Cited

U.S. PATENT DOCUMENTS

| | | | |
|---|---|---|---|
| 4,455,467 | 6/1984 | Dills | 219/10.55 E |
| 5,000,113 | 3/1991 | Wang et al. | 118/729 X |
| 5,044,943 | 9/1991 | Bowman et al. | 432/121 |
| 5,332,443 | 7/1994 | Chew et al. | 118/729 |
| 5,421,893 | 6/1995 | Perlow | 118/729 X |
| 5,611,865 | 3/1997 | White et al. | 118/729 X |
| 5,820,686 | 10/1998 | Moore | 118/729 X |

*Primary Examiner*—Steven A. Bratlie
*Attorney, Agent, or Firm*—Thomason, Moser & Patterson

[57] ABSTRACT

The present invention generally provides a system and method for supporting a substrate having a support frame that minimizes deflection encountered during thermal expansion in a processing chamber. In one embodiment, the support frame comprises one or more longitudinal members coupled to one or more transverse members. The transverse members preferably define a supporting surface on which a heated susceptor is mounted. The longitudinal member is preferably disposed below the heated susceptor, thus minimizing thermal expansion of the longitudinal member. Spacers made of thermally conductive material may be disposed at appropriate locations along the members to provide more uniform distribution of heat within the members.

22 Claims, 5 Drawing Sheets

SUPPORT FRAME FOR SUBSTRATES

BACKGROUND OF THE INVENTION

1. Field of the Invention

The present invention relates to a substrate processing system in the electronics industry. More specifically, the invention relates to a system and method for supporting substrates in a substrate processing system.

2. Background of the Related Art

Substrates on which physical vapor deposition (PVD), chemical vapor deposition (CVD), etching, electroplating, planarization and other processes are performed are used to manufacture integrated circuits (ICs), flat panel displays (FPDs) and other electronic components. Round substrates, typically known as wafers, are used to create a plurality of ICs by cutting the wafers into individual die after deposition and other processing. The typical size for a semiconductor wafer is about 200 mm with a thickness of less than 0.5 mm and a mass of about 60 grams. Typical substrate processing requires planar support of the substrate to ensure uniform deposition across the substrate surface in the processing chamber. The relatively small size and light weight of the wafers require minimal structural support to retain a planar processing position.

Conceptually, FPDs are produced by similar processes as are performed in the fabrication of ICs, such as etching, deposition, and planarization. Generally, multiple metallic interconnects, liquid crystal cells and other devices are formed on a glass substrate to produce the FPD. The various devices are integrated into a system that collectively is used to create, for example, active matrix display screens in which display states are electrically created in individual pixels on the FPD. Overall processing uniformity across the entire surface of the FPD is critical for the FPD to function properly and defects in the FPD as a whole need to approach zero.

A typical glass substrate has increased in size from about 200 mm by 300 mm to about 680 mm by 880 mm and a mass of about 2 to about 3 kilograms. The size is continuing to increase as the demand for larger screens or displays increases.

FIG. 1 is a schematic cross-sectional view of a processing chamber 2, such as a CVD chamber having a top 4, bottom 6, sidewalls 8, a support plate 18 and a susceptor 22 disposed therein to support an FPD substrate 12. In general, CVD processing is the formation of a non-volatile solid layer on a substrate by the reaction of vapor phase chemicals, termed "reactants", which contain the required constituents to be deposited. The reactants enter a system and are decomposed and/or reacted on a substrate to form a desired layer of material thereon. Reactive gases are flown through a gas inlet 14 into a gas manifold 16 that is mounted near the top of the chamber. An opening 10 is disposed in the sidewall 8 to allow a robot (not shown) to deliver and retrieve the substrate 12 to and from the chamber. A support plate 18 is coupled to a support stem 20 and supports the susceptor 22. The support plate 18 is typically made of a single rectangular plate of ceramic material, such as aluminum oxide, and closely covers the area of the susceptor 22. The susceptor 22 historically has been made of a single rectangular plate of aluminum and is typically heated with a heater (not shown) with energy supplied from a power source 24. A susceptor sized to accommodate the larger substrates, such as a 680 mm by 880 mm substrate, can have a mass of about 130 kg. Even larger substrates may require a larger susceptor with a mass of about 230 kg.

Typical temperatures for CVD processes can reach up to about 430° C. Aluminum begins to exhibit "liquid" type properties at about 660° C. and, thus, at the operating ranges of the CVD processes, the aluminum susceptor 22 can deflect and "droop" without adequate support. The ceramic material of the support plate 18 has been used to support the ductile aluminum susceptor. However, ceramic is a relatively poor thermal conductor and, thus, demonstrates a temperature gradient between a hotter upper surface of the support plate 18 that contacts the heated susceptor and a cooler lower surface of the support plate 18. The thermal gradient can cause the hotter upper surface of the substrate to expand a greater distance than the cooler lower surface, and as a result, the support plate 18 deflects downwardly at its outer perimeter. Furthermore, as the support plate 18 deflects, the ductile aluminum susceptor deflects in conformance with the deflected support plate. A substrate supported by the susceptor is prone to conform to the susceptor and, thus, also deflects. As a result, the vertical spacing between the gas manifold 16 and the substrate 12 varies between a central section of the substrate having a distance 34 from the manifold and a peripheral region having a greater distance 36. The difference in spacing decreases deposition and other processing uniformity.

Therefore, there remains a need for a system having a support with reduced deflection for substrates, particularly larger substrates.

SUMMARY OF THE INVENTION

The present invention generally provides a system and method for supporting a substrate having a support frame that minimizes deflection encountered during thermal expansion in a processing chamber. In one embodiment, the support frame comprises one or more longitudinal members coupled to one or more transverse members. The transverse members preferably define a supporting surface on which a heated susceptor is mounted. The longitudinal member is preferably disposed below the heated susceptor, thus minimizing thermal expansion of the longitudinal member. Spacers made of thermally conductive material may be disposed at appropriate locations along the members to provide more uniform distribution of heat within the members and to compensate for vertical deflection.

In another aspect, the invention provides a substrate processing system, comprising at least one chamber, a robot disposed in proximity to the chamber, and a support frame having at least one longitudinal member and at least one transverse member coupled to the longitudinal member. In another aspect, the invention provides a system for supporting a susceptor, comprising a longitudinal member supporting one or more transverse members. In another aspect, the invention provides a system for supporting substrates with a support frame in a substrate processing system, the support frame comprising at least one longitudinal member and at least one transverse member coupled to the longitudinal member.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a system and method for supporting a substrate. The invention provides a support frame that minimizes deflection encountered during thermal expansion and provides a surface on which a susceptor and/or substrate may be supported. One embodiment comprises one or more longitudinal members coupled to one or more transverse members. Preferably, the transverse members are disposed in thermal communication with a susceptor. The longitudinal member is connected to the transverse members at a location spaced from the susceptor to avoid direct contact with the susceptor to minimize differential heating and resulting thermal expansion thereof.

Figure 1:
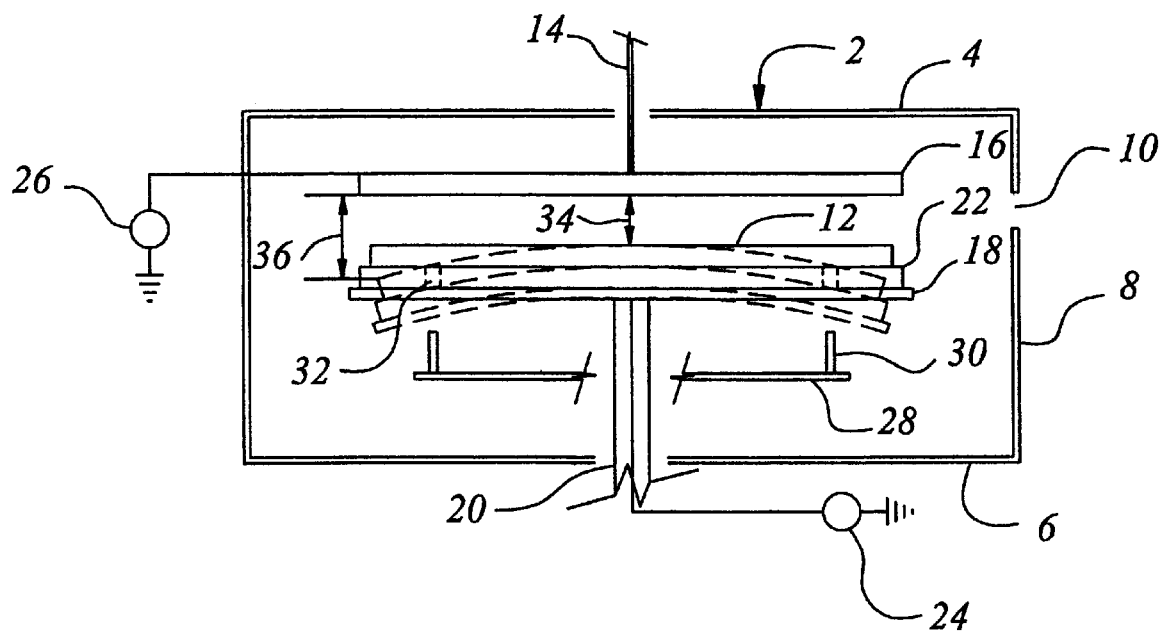
FIG. 1 is a schematic cross-sectional view of a typical chemical vapor deposition (CVD) system having a unitary support plate.
Figure 2:
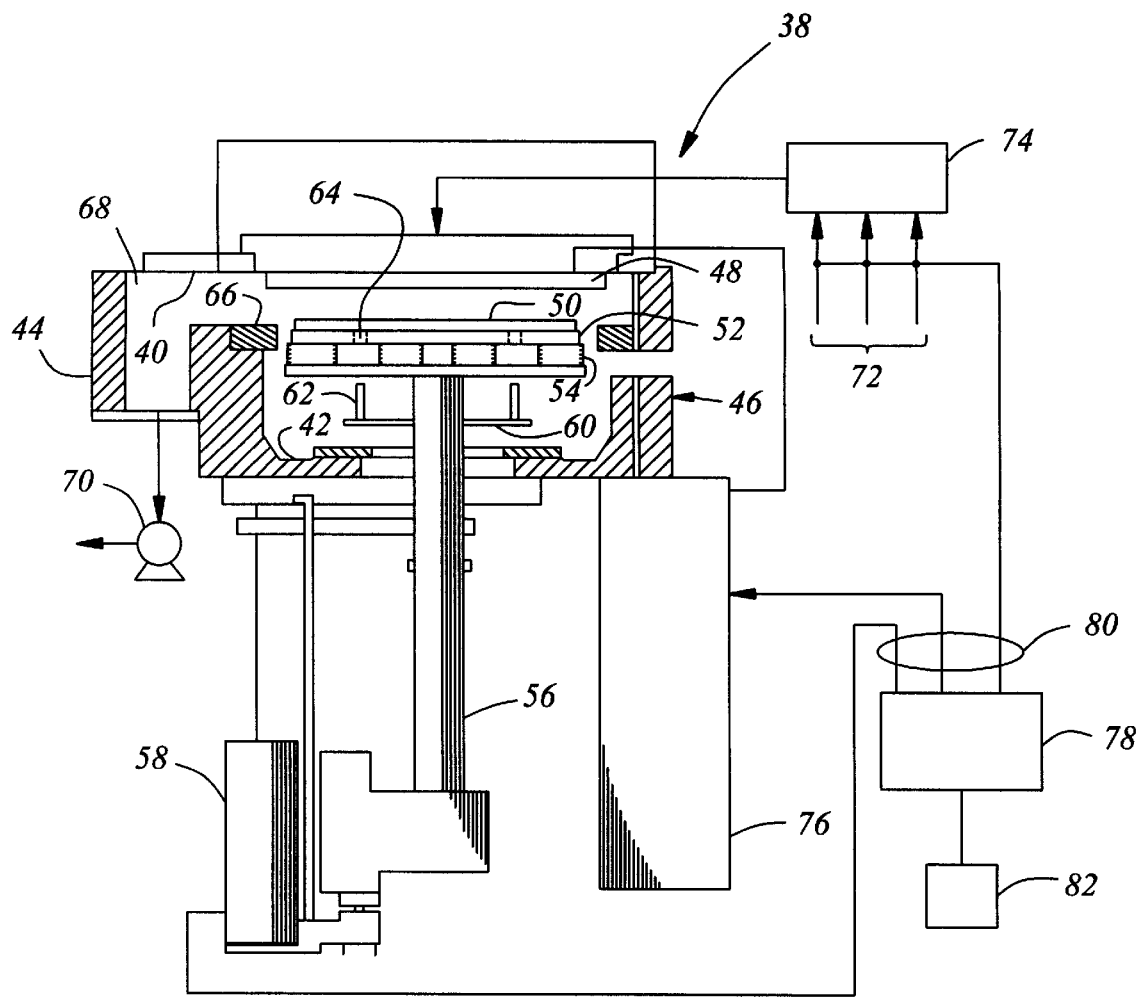
FIG. 2 is a schematic cross-sectional view of a CVD chamber having a support frame of the present invention.

FIG. 2 is a schematic side view of a chemical vapor deposition (CVD) chamber 38, such as a CVD chamber available from Applied Komatsu Technology, Inc. having offices in Santa Clara, Calif. The chamber 38 is a parallel plate CVD chamber having a top 40, bottom 42, sidewalls 44 and an opening 46 disposed in the sidewall through which substrates are delivered and retrieved from the chamber. Chamber 38 contains a gas distribution manifold 48, known as a diffuser, for dispersing process gases through perforated holes in the manifold to a substrate 50 that rests on a susceptor 52.

Susceptor 52 is mounted on a support frame 54 and the support frame 54 is mounted on a support stem 56. The susceptor 52 is typically a plate of aluminum and is heated by a resistive heater (not shown) embedded in the susceptor 52. The heater provides rapid and uniform susceptor and substrate heating during deposition. The susceptor 52 and the substrate 50 supported on the susceptor 52 can be controllably moved by a lift motor 58, known as a Z-drive, to adjust the spacing between the manifold 48 and the substrate 50. The spacing typically ranges between about 200 mils to about 1000 mils. The susceptor 52 is movable between a lower loading/off-loading position and an upper processing position that is closely adjacent to the manifold 48. A lift plate 60 having lift pins 62 is disposed below the support frame 54. When the support frame 54 is lowered, the lift pins 62 protrude through spaces in the support frame 54 and through holes 64 in the susceptor 52 to lift the substrate 50 from the susceptor and facilitate delivery and retrieval of the substrate 50 to and from the chamber 38. Alternatively, holes can be provided in one or more of the members of the support frame to allow the lift pins 62 to protrude through the members and through the susceptor to lift the substrate from the susceptor. An insulator 66 surrounds the susceptor 52 and the substrate 50.

Deposition and carrier gases are input through gas supply lines 72 into a mixing system 74 where they are combined and then sent to manifold 48. Alternatively, the mixing system 74 may be omitted and the gases flown to the manifold 48 directly. Generally, the process gas supply lines 72 for each of the process gases include i) safety shut-off valves (not shown) that can be used to automatically or manually shut off the flow of process gas into the chamber, particularly when toxic gases are used in the process, and ii) mass flow controllers (also not shown) that measure the flow of gas through the gas supply lines. During processing, gases flown to manifold 48 are uniformly distributed across the surface of the substrate. The gases exhaust through a port 68 by a vacuum system 70 having a throttle valve (not shown) to control the pressure in the chamber 38 by controlling the exhaust rate of gas from the chamber 38.

The deposition process performed in chamber 38 can be any process, such as a thermal process or a plasma-enhanced process. In a plasma-enhanced process, a controlled plasma is formed adjacent to the substrate by RF energy applied to gas distribution manifold 48, or another plasma energizing device or structure, from an RF power supply 76. The susceptor 52 is grounded and the manifold 48 is electrically isolated from the chamber surfaces. The plasma creates a reaction zone between the gas distributor manifold 48 and the substrate 50 that enhances the reaction between the process gases. RF power supply 76 can provide either single or mixed frequency RF power to manifold 48 to enhance the decomposition of reactive species introduced into chamber 38. A mixed frequency RF power supply typically provides power at a high RF frequency (RF1) of about 13.56 MHz and at a low RF frequency (RF2) of about 350 kHz.

Typically, any or all of the chamber linings, gas distribution manifold 48, support stem 56, and various other chamber hardware are made of material such as aluminum or aluminum oxide. An example of such a CVD chamber is described in U.S. Pat. No. 5,000,113, entitled "Thermal CVD/PECVD Chamber and Use for Thermal Chemical Vapor Deposition of Silicon Dioxide and In-situ Multi-step Planarized Process," issued to Wang et al., and assigned to Applied Materials, Inc., the assignee of the present invention.

The lift motor 58, the gas mixing system 74, and the RF power supply 76 are controlled by a system controller 78 over control lines 80. The chamber includes analog assemblies such as mass flow controllers (MFCs), RF generators, and lamp magnet drivers that are controlled by the system controller 78 which executes system control software stored in a memory 82. Motors and optical sensors are used to move and determine the position of movable mechanical assemblies such as the throttle valve of the vacuum system 70 and lift motor 58 for positioning the susceptor 52. The system controller 78 controls all of the activities of the CVD chamber and preferably includes a hard disk drive, a floppy disk drive, and a card rack. The card rack contains a single board computer (SBC), analog and digital input/output boards, interface boards and stepper motor controller boards. The system controller preferably conforms to the Versa Modular Europeans (VWE) standard that defines board, card cage, and connector dimensions and types.

Figure 3:
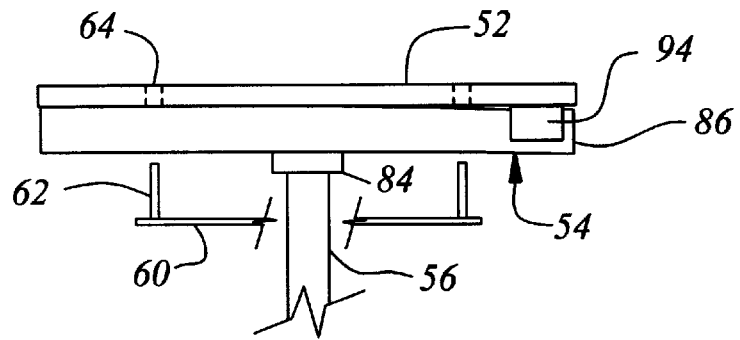
FIG. 3 is a schematic side view of the support frame.

FIG. 3 is a schematic side view of the support frame 54. A support stem 56 is coupled to the support frame 54 and the support frame 54 supports the susceptor 52. In one embodiment, the support frame 54 comprises at least one longitudinal member 84 and at least one transverse member 86, preferably a plurality of transverse members, mounted on the longitudinal member 84. Alternatively, the longitudinal member and the transverse members could be disposed in a single plane, for example, by slotting each member to fit the corresponding other member. The longitudinal member 84 and transverse members 86 have rectangular cross-sections, although other shapes can be used. Preferably, the support frame interposes the transverse members between the heat source, such as a heated susceptor, and the longitudinal member, so that the longitudinal member does not directly contact the heated susceptor to reduce thermal expansion of the longitudinal member. The longitudinal and transverse members are made of a ceramic material such as aluminum oxide or other structurally suitable material. In some instances, the material can be metal alloys that are heat resistant and have a lower coefficient of expansion compared to aluminum, such as stainless steel.

Figure 4:
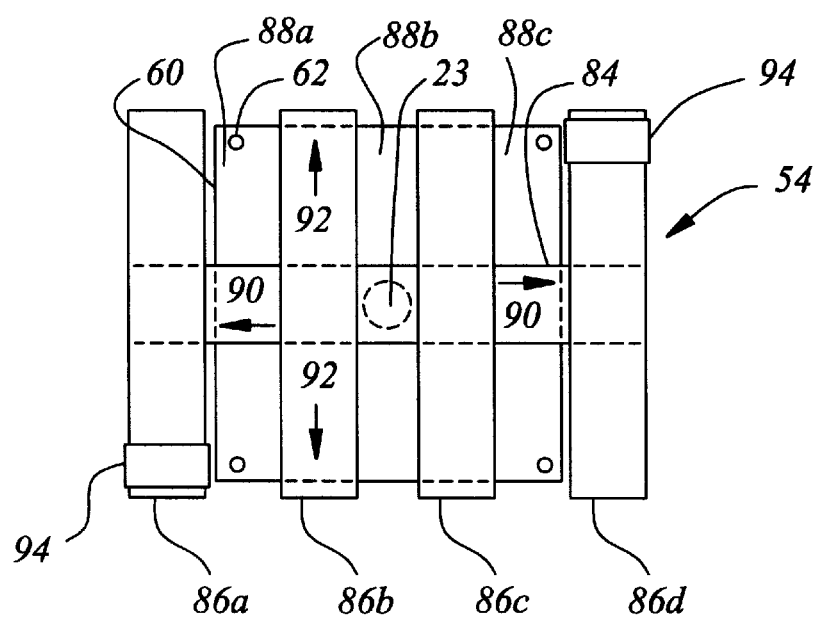
FIG. 4 is a schematic top view of the support frame.

FIG. 4 is a schematic top view of the support frame shown in FIG. 3. A plurality of transverse members 86a–d are positioned above a longitudinal member 84. The transverse members are spaced apart from each other to define lateral spaces 88a–c. Preferably, the thermal expansion of the longitudinal member is reduced by avoiding direct contact with the heated susceptor 52 (shown in FIG. 3).

It is believed that the support frame 54 dissipates thermal expansion among several smaller members. The members of the present invention are more able to uniformly expand and, thus, stress cracks are reduced. For instance, the greatest expansion of the longitudinal member occurs in the direction 90 along the length of the longitudinal member. The expansion of the longitudinal member 84 in the direction 90 has less effect on the transverse members 86a and 86b compared to a typical support plate because of the separation between the transverse members. The expansion is divided among the transverse members, preferably separated by lateral spaces 88a–c, so that stresses on the material are reduced. Likewise, the total expansion of the transverse member 86 in the direction 92 in contact with a uniformly heated susceptor would generally be greater at the transverse member ends than at the center because of the cumulative effect of the length of the transverse members. Therefore, the expansion of the transverse members in the direction 92 would have less transverse effect on the centrally located longitudinal member coupled to the transverse member compared to a typical support plate.

The support frame constructively uses the low, compared to aluminum, heat transfer coefficient to thermally insulate the longitudinal member from the susceptor heat and further reduce thermal expansion. Preferably, only the transverse members 86 contact the susceptor 52 shown in FIG. 3. The thermal resistance of the ceramic material in the transverse members 86 reduces or eliminates the heat conducted to the longitudinal member 84. It is believed that thermal expansion of the longitudinal member is minimized at least along the length of the longitudinal member because the longitudinal member is not in thermal contact with the heated susceptor by being mounted away from the susceptor. As a result, the longitudinal member has less of a thermal gradient from the top surface to the bottom surface and deflection at least in the longitudinal direction is minimized.

The support frame 54 can also include spacers 94, shown assembled on the support frame 54 in FIGS. 3 and 4. The spacers 94 accommodate the deflection of the support frame, if any deflection occurs. For instance, the transverse members 86 may deflect by being in contact with a heated susceptor 52. One or more spacers can be assembled to the support frame preferably along any top surface of the transverse members 86 where deflection occurs, which may be experimentally determined, to provide a planar alignment of the upper surface of spacer(s) and upper surfaces of the support frame to maintain planarity of the susceptor 52. For example, a spacer 94 may be disposed on one end of one transverse member 86a and on another end of another transverse member 86d if deflection is determined to occur at those locations. Alternatively, each end of each member may have spacers disposed thereon.

The spacers 94 are generally placed in position prior to any deflection. The spacers would support the susceptor 52 above at least a portion of the surface of the support frame 54. When the support frame 54 deflects in processing, the susceptor 52 could be supported by the spacer(s) and a portion of the support frame, generally the center of the support frame, to establish the susceptor in a satisfactory planar position.

Figure 5:
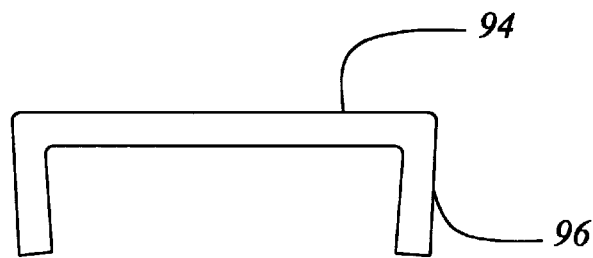
FIG. 5 is a schematic side view of a spacer.
Figure 6:
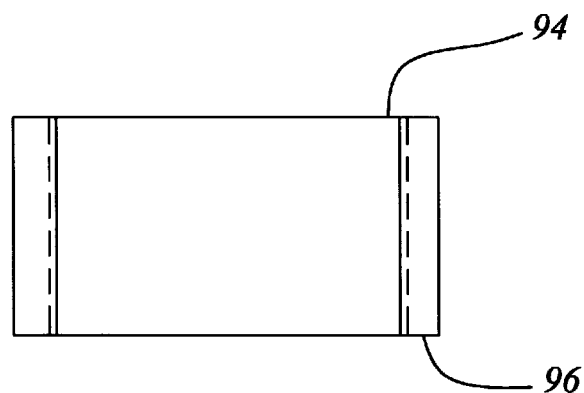
FIG. 6 is a schematic top view of the spacer.

FIG. 5 is a schematic side view of the spacer 94. FIG. 6 is a schematic bottom view of the spacer. The spacer 94 is "C" shaped and includes two ends 96. As best viewed in FIG. 6, the spacer is rectangular in shape. Preferably, the spacer ends 96 are angled and sized to clasp the transverse members 86 and remain in position until removed.

The spacers are preferably made of conductive material, such as aluminum. The conductive material allows heat to be conducted more uniformly throughout the spacer and around the edges 96 to the sides of the transverse members 86. Thus, the heat on the upper surface of the transverse members is allowed to thermally diffuse to the lower surfaces of the transverse members. The thermal gradient in the transverse members is reduced in the region of the spacer(s) and stress cracking of the members is further reduced.

Figure 7:
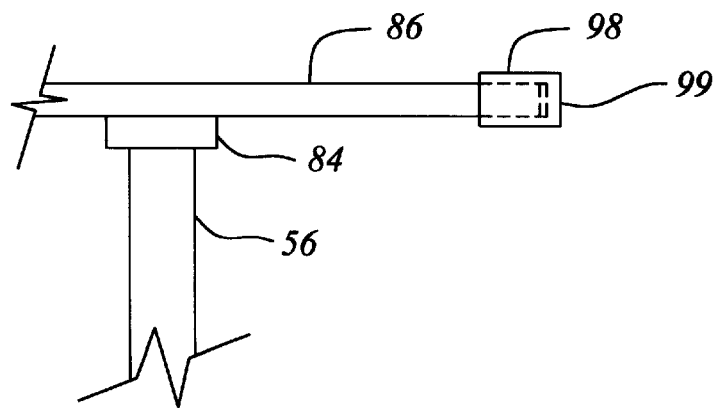
FIG. 7 is a schematic of another embodiment of the spacer.

FIG. 7 is a schematic of another embodiment of a spacer 98. The spacer 98 can form a band around, for example, a transverse member 86. The spacer 98 can include a bottom 99 so that spacer 98 forms a "boot". It is believed the spacer 98 distributes heat more evenly around the member that the spacer surrounds.

Figure 8:
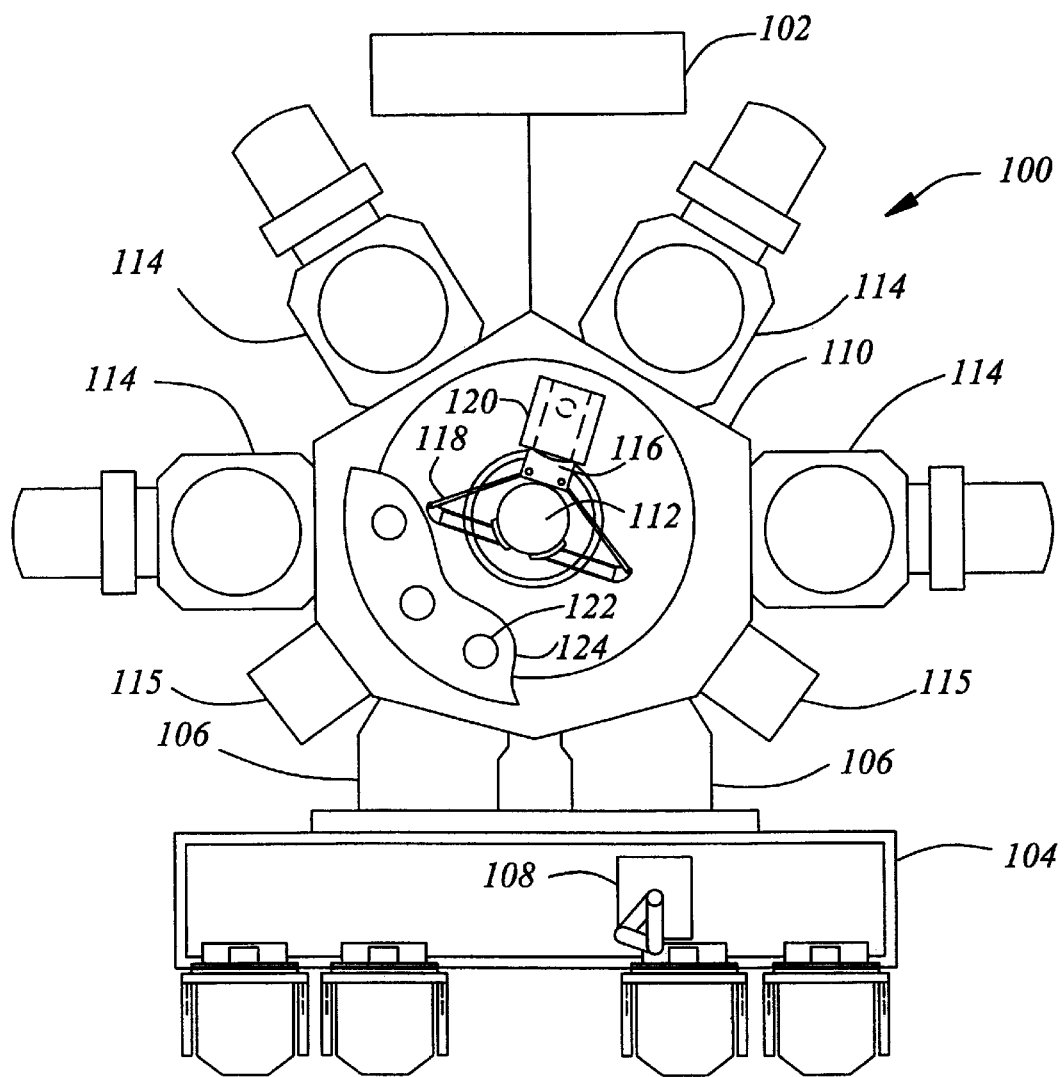
FIG. 8 is a schematic top view of a processing system used to advantage with the support frame.

The CVD chamber shown in FIG. 2 can be incorporated into a system using other chambers as well. For instance, FIG. 8 is a schematic top view of an exemplary cluster processing system 100. A portion of the lid 124 has been cut away to reveal details of the processing system 100. The processing system 100 is typically known as a cluster tool. One such system is available from Applied Komatsu Technology, Inc. The details of an exemplary staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. The exact arrangement and combination of the chambers may be altered for purposes of performing specific steps of a fabrication process. Other processing systems, such as inline processing systems, could be used instead of the cluster tool processing system.

The processing system 100 generally comprises a plurality of chambers and robots and is preferably equipped with a microprocessor/controller 102 programmed to control the various processing methods performed in the processing system 100. A front-end environment 104 is shown positioned in selective communication with a pair of load lock chambers 106. A pod loader 108 disposed in the front-end environment 104 is capable of linear and rotational movement to shuttle cassettes of substrates to and from the load locks 106. The load locks 106 provide a first vacuum interface between the front-end environment 104 and a transfer chamber 110. A robot 112 is centrally disposed in the transfer chamber 110 to transfer substrates from the load locks 106 to one of the various processing chambers 114 and service chambers 115. The robot 112 is a frog-leg type robot capable of extension, retraction, and rotation and is actuated by a stepper motor. A support member 116 connected to the robot linkage 118 is adapted to support a substrate 120 during transfer through the transfer chamber 110 and between the chambers 114, 115 and the load locks 106. The processing chambers 114 may perform any number of processes such as PVD, CVD, electroplating and etching while the service chambers 115 are adapted for degassing, orientation, cool down and the like. A number of view ports 122 formed in a lid 124 of the transfer chamber 110 provide visual access into the transfer chamber 110. While the above system is exemplary, the invention has application in any arrangement that supports a substrate, and, thus, it is understood that other applications of the invention are contemplated.

Variations in the orientation of the support frame, support members, substrates, chambers, and other system components are possible. Additionally, all movements and positions, such as "above", "top", "below", "under", "bottom", "side", described herein are relative to positions of objects such as the support frame, support members, substrates, and chambers. Accordingly, it is contemplated by the present invention to orient any or all of the components to achieve the desired support of substrates in a processing system.

While foregoing is directed to the preferred embodiment of the present invention, other and further embodiments of the invention may be devised without departing from the basic scope thereof and the scope thereof is determined by the claims that follow.

What is claimed is:

1. A substrate processing system, comprising:
    a) at least one chamber;
    b) a robot disposed in proximity to the chamber; and
    c) a support frame for supporting a susceptor having at least one longitudinal member and a plurality of transverse members coupled to the longitudinal member, the transverse members arranged to define at least one lateral space therebetween.

2. The system of claim 1, wherein the at least one longitudinal member supports least two of the transverse members.

3. The system of claim 1, further comprising a support stem coupled to the support frame.

4. The system of claim 1, further comprising a susceptor disposed between the support frame and a substrate supporting surface on the susceptor.

5. The system of claim 1, wherein the transverse members are mounted on the longitudinal member and defines a susceptor supporting surface on an upper surface thereof.

6. The system of claim 5, wherein the transverse members are disposed between a susceptor and the longitudinal member.

7. The system of claim 6, wherein the transverse members contact the susceptor and insulates the longitudinal member from the susceptor.

8. The system of claim 1, further comprising at least one spacer coupled to the support frame.

9. The system of claim 1, wherein at least a portion of the support frame comprises ceramic material.

10. The system of claim 7, wherein the transverse members comprise a ceramic material.

11. An apparatus for supporting a susceptor in a substrate processing system, comprising a support frame having at least one longitudinal member supporting a plurality of transverse members, the transverse members arranged to define at least one space therebetween.

12. The apparatus of claim 11, wherein the at least one longitudinal member is coupled to the plurality of transverse members and provides support for the transverse members.

13. The apparatus of claim 12, wherein the transverse members are mounted on the longitudinal member and define a susceptor supporting surface on an upper surface thereof.

14. The apparatus of claim 11, further comprising a support stem coupled to the support frame.

15. The apparatus of claim 12, wherein at least two of the transverse members are disposed along a length of the at least one longitudinal member in a spaced relationship to one another.

16. The apparatus of claim 12, wherein the support frame is disposed in a substrate processing system and the transverse members are disposed between a susceptor in the processing system and the longitudinal member.

17. The apparatus of claim 16, wherein the transverse members contact the susceptor and insulate the longitudinal member from the susceptor.

18. The apparatus of claim 11, further comprising at least one spacer coupled to the support frame.

19. The apparatus of claim 11, wherein at least a portion of the support frame comprises ceramic material.

20. The apparatus of claim 17, wherein at least one of the transverse members comprises a ceramic material.

21. A system for supporting a susceptor with a support frame in a substrate processing system, the support frame comprising:
    a) at least one longitudinal member; and
    b) a plurality of transverse members coupled to the longitudinal member, at least a portion of the transverse members being disposed between the susceptor and the longitudinal member.

22. The system of claim 21, further comprising at least one spacer coupled to at least one of the transverse members that engages a substrate supported on the transverse members.

* * * * *

UNITED STATES PATENT AND TRADEMARK OFFICE
CERTIFICATE OF CORRECTION

PATENT NO. : 6,149,365
DATED : Nov. 21, 2000
INVENTOR(S) : White et al.

It is certified that error appears in the above-identified patent and that said Letters Patent is hereby corrected as shown below:

Column 4, line 69, replace "(VWE)" with "(VME)"

Signed and Sealed this

Twenty-ninth Day of May, 2001

Attest:

NICHOLAS P. GODICI

Attesting Officer      Acting Director of the United States Patent and Trademark Office